United States Patent [19]

Cronin et al.

[11] Patent Number: 4,776,087
[45] Date of Patent: Oct. 11, 1988

[54] VLSI COAXIAL WIRING STRUCTURE

[75] Inventors: John E. Cronin, Milton; Michael A. Leach, Colchester, both of Vt.

[73] Assignee: International Business Machines Corporation, Armonk, N.Y.

[21] Appl. No.: 43,264

[22] Filed: Apr. 27, 1987

[51] Int. Cl.$^4$ ............................................. H01B 13/20
[52] U.S. Cl. ........................................ 29/828; 29/600;
333/243; 427/96; 427/123; 427/126.1;
427/126.3; 427/126.4
[58] Field of Search ...................... 333/1, 12, 238, 243;
29/600, 828; 427/96, 123, 126.1, 126.3, 126.4

[56] References Cited

U.S. PATENT DOCUMENTS

| | | |
|---|---|---|
| 3,351,816 | 11/1967 | Sear et al. |
| 3,370,184 | 2/1968 | Zuleeg |
| 3,560,893 | 2/1971 | Wen |
| 3,904,997 | 9/1975 | Stinehelfer, Sr. ................... 333/238 |
| 4,379,307 | 4/1983 | Soclof ............................ 333/238 X |
| 4,389,429 | 6/1983 | Soclof ................................... 427/90 |
| 4,575,700 | 3/1986 | Dalman ............................. 333/238 |
| 4,581,291 | 4/1986 | Bongianni ........................ 428/381 |
| 4,673,904 | 6/1987 | Landis ................................ 333/238 |

OTHER PUBLICATIONS

Chalman et al., *Multiple Function of Blind Copper Vias in Polyimide Multi-Layer Structure*, 4th Annual Int'l. Electronics Packaging Confer., Oct.'84.

*Primary Examiner*—Paul Gensler
*Attorney, Agent, or Firm*—Mark F. Chadurjian

[57] ABSTRACT

A coaxial wiring structure that is constructed by depositing and etching a series of conductor layers and insulator layers. More specifically, the shielded transmission line of the invention comprises a first plate structure disposed on a first insulator layer disposed on a substrate; a second insulator layer disposed on the first insulator layer and the first plate structure, the second insulator layer having first troughs exposing end portions of the first plate structure; a central conductor and at least two peripheral conductors disposed on the second insulator layer, the two peripheral conductors contacting the end portions of the first plate structure through the first troughs; a third insulator layer disposed on the second insulator layer, the two peripheral conductors, and the central conductor, the third insulator layer having second troughs exposing respective ones of the peripheral conductors; and an upper plate structure formed on the third insulator layer, the upper plate structure contacting the peripheral conductors through the second troughs. In combination, the upper plate structure, the peripheral conductor structures and the lower plate structure surround the central conductor and are insulated therefrom by the respective insulator layers. The surrounding conductors are coupled to ground potential, and high frequency transmission signals are propagated along the central conductor.

4 Claims, 3 Drawing Sheets

VLSI COAXIAL WIRING STRUCTURE

TECHNICAL FIELD

The invention relates to a shielded transmission line structure fabricated in VLSI dimensions, as well as to a manufacturing method for making such a structure.

BACKGROUND ART

In integrated circuit technology, increasing device density has led to a decrease in the spacing between adjacent metal lines. As metal lines are formed closer together, the potential for capacitive and inductive signal interference between the lines increases. This interference is particularly troublesome when high frequency signals are propagated over adjacent lines.

In the prior art, this problem has been dealt with by constructing a metal line that is partially or totally shielded by a metal structure surrounding the metal line. A varying signal is propagated along the metal line, and the metal structure is coupled to ground potential. In combination, the two lines produce a negligible external electromagnetic field while also having a negligible susceptibility to external fields from adjacent lines. Examples of these prior art structures, as shown in FIGS. 1–5 of the present application, will now be reviewed in more detail.

U.S. Pat. No. 3,560,893 (issued 2/2/71 to Wen and assigned to RCA Corp.) discloses a partially shielded transmission line. As shown in FIG. 1 (Prior Art) the structure consists of a metal line 27 that is etched to define a central conductor 37 disposed on a dielectric substrate 25. A metal capsule 23 is bonded to the etched conductor lines 27, and is coupled to ground potential so as to partially shield inner conductor 37 from adjacent lines. The inner conductor 37 is separated from the outer conductors by air.

U.S. Pat. No. 4,575,700 (issued 3/11/86 to Dalman and assigned to Cornell Research Foundation, Inc.) discloses a partially shielded "slot-line" transmission line structure. As shown in FIG. 2 (Prior Art), conductive line 26b is deposited over a portion of a silicon substrate that is defined by two parallel grooves etched in the surface of a silicon substrate. Adjacent conductive lines 26a, 26c are formed on the opposite surfaces of the etched grooves, and the entire structure is overcoated with a dielectric 28 so as to isolate the lines from one another. Optionally, a third conductive line 40 may be formed over the structure. The conductive lines 26a, 26c and 40 are coupled to ground so as to partially shield the inset conductive line 26b that is coupled to a source of varying potential.

U.S. Pat. No. 3,370,184 (issued 2/20/68 to Zuleeg and assigned to Hughes Aircraft Company) discloses a totally shielded transmission line. As shown in FIG. 3 (Prior Art), a pair of metal (or doped silicon) lines 2, 4 sandwich a central conductor 6 having a dielectric 23 disposed about its periphery. Cadmium sulfide 8 separates the dielectric 23 from the metal lines 2, 4. The metal lines are coupled to ground and the central conductor receives a varying input signal.

U.S. Pat. No. 4,581,291 (issued 4/8/86 to Bongianni and unassigned on its face) discloses a micro-miniature coaxial conductor. As shown in FIG. 4 (Prior Art), an inner conductor 20 is formed of a copper wire having lateral dimensions in the 100 micron range. The conductor is then surrounded by a foamed dielectric 22 and a layer of chemical vapor deposited (CVD) parylene. The entire structure is then coated with an outer metal casing 24.

U.S. Pat. No. 3,351,816 (issued 11/7/67 to Sear et al and assigned to Bunker Ramo Corp.) discloses a planar coaxial type structure. As shown in FIG. 5 (Prior Art), aluminum plates 1b, 1c have a central aperture formed therein that is filled with a dielectric material 5. In turn, an aperture is formed within the dielectric material 5, and a conductive layer 7 is coated on the exposed sidewalls of the aperture. The metal layer 7 defines a through hole into which a wire 3 is inserted. The aluminum plates 1b, 1c are coupled to ground potential, and surround the central conductors 3, 7 so as to define a coaxial structure.

Reference is made to the following patents for further teachings of partially shielded transmission lines. U.S. Pat. No. 4,379,307 and U.S. Pat. No. 4,389,429 (issued 4/5/83 and 6/21/83, respectively, to Soclof and assigned to Rockwell International Corp.) disclose a conductive line that is defined and a portion of a silicon substrate that is subsequently etched so that the line is supported by a series of support ridges. As a result, the conductive line is isolated from adjacent conductors by air. U.S. Pat. No. 3,904,997 (issued 9/9/75 to Stinehelfer Sr. and assigned to Microwave Associates, Inc.) discloses a microwave transmission line formed on a dielectric body that is bonded to a conductive material having a channel formed therein. The conductive line lies within the channel, such that it is separated from the ground plane by air.

The above prior art transmission line structures pose several disadvantageous features. In the prior art structures shown in FIGS. 1 and 2, note that there is no electrical shielding provided below the central conductors 37 and 26b, respectively. While the prior art transmission line structures shown in FIGS. 3–5 do provide total shielding, the methods of manufacturing these structures are totally incompatible with current metallization processing techniques. That is, these structures would have to be formed before or after the remainder of the chip is metallized.

Accordingly, there is a need in the art to develop a totally shielded transmission line structure that is compatible with current integrated circuit metallization techniques.

DISCLOSURE OF THE INVENTION

It is thus an object of the present invention to provide a totally shielded transmission line structure.

It is another object of the invention to provide a shielded transmission line structure that is compatible with current integrated circuit metallization techniques.

It is yet another object of the invention to provide a shielded transmission line structure having lateral dimensions in the micron range.

These and other objects of the invention are realized by a coaxial wiring structure that is constructed by depositing and etching a series of conductor layers and insulator layers. More specifically, the shielded transmission line of the invention comprises a first plate structure disposed on a first insulator layer disposed on a substrate; a second insulator layer disposed on the first insulator layer and the first plate structure, the second insulator layer having first troughs exposing end portions of the first plate structure; a central conductor and at least two peripheral conductors disposed on the second insulator layer, the two peripheral conductors contacting the end portions of the first plate structure through the first troughs; a third insulator layer disposed on the second insulator layer, the two peripheral conductors, and the central conductor, the third insulator layer having second troughs exposing respective ones of the peripheral conductors; and an upper plate structure formed on the third insulator layer, the upper plate structure contacting the peripheral conductors through the second troughs. In combination, the upper plate structure, the peripheral conductor structures and the lower plate structure surround the central conductor and are insulated therefrom by the respective insulator layers. The surrounding conductors are coupled to ground potential, and high frequency transmission signals are propagated along the central conductor.

BRIEF DESCRIPTION OF THE DRAWING

The foregoing and other structures and teachings will be better understood upon a review of the description for carrying out the best mode of the invention as rendered below. In the description to follow, reference will be made to the accompanying Drawing, in which.

DESCRIPTION OF THE BEST MODE FOR CARRYING OUT THE INVENTION

Figure 1:
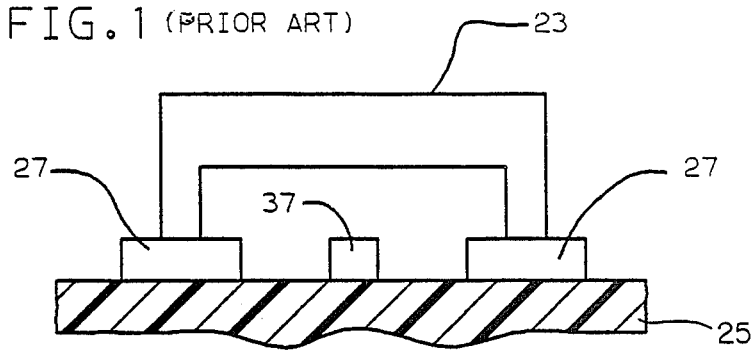
FIG. 1 (Prior Art) shows a cross sectional view of a first partially shielded transmission line known in the prior art.
Figure 2:
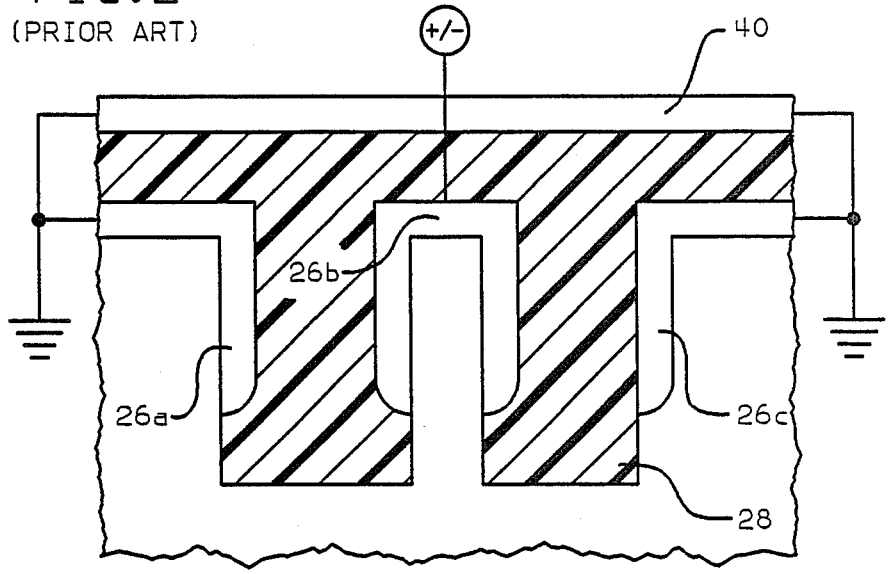
FIG. 2 (Prior Art) shows a cut away view of a second partially shielded transmission line known in the prior art.
Figure 3:
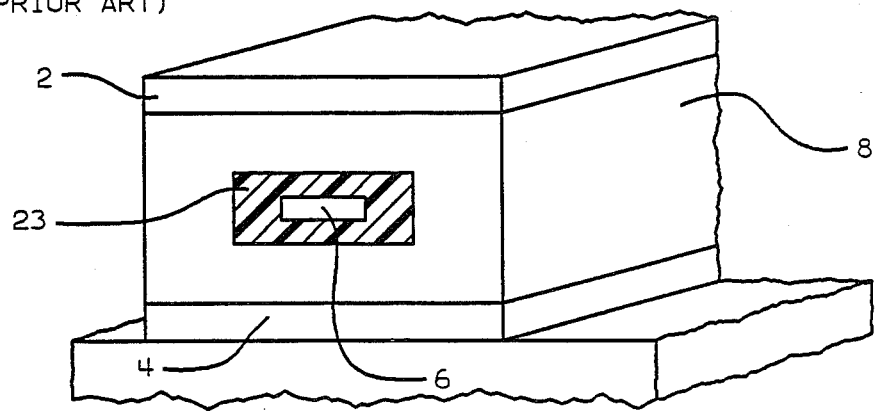
FIG. 3 (Prior Art) shows a cross sectional view of a first totally shielded transmission line known in the prior art.
Figure 4:
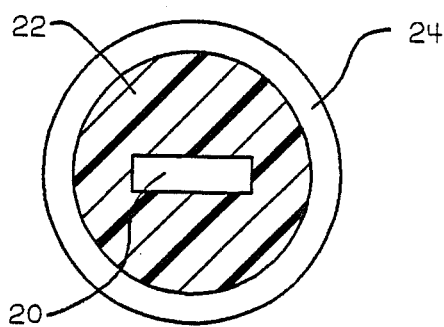
FIG. 4 (Prior Art) shows a cross sectional view of a second totally shielded transmission line known in the prior art.
Figure 5:
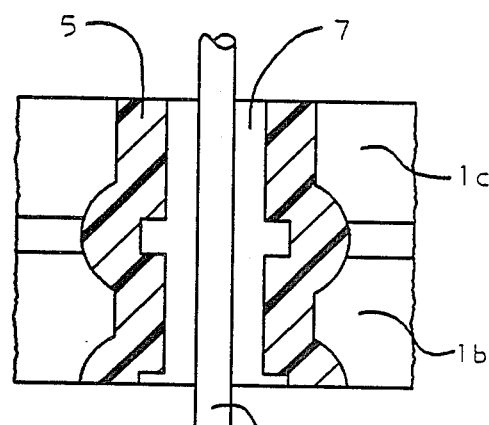
FIG. 5 (Prior Art) shows a cut away view of a third totally shielded transmission line known in the prior art.
Figure 6:
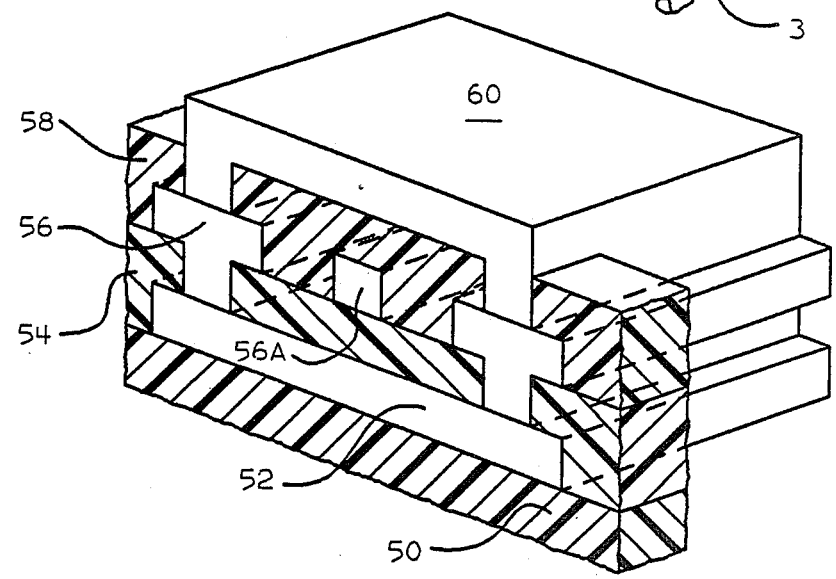
FIG. 6 shows a cross sectional view of a first embodiment of the totally shoelded transmission line of the present invention.

With reference to FIG. 6, a cross-sectional view of totally shielded transmission line structure compatible with current integrated circuit metallization techniques is shown. Upper and lower plate structures defined by conductor layers 60 and 52, respectively, are coupled together by peripheral conductor structures defined by conductor layer 56. The peripheral conductor structures are disposed about and spaced from a central conductor structure 56A. High frequency signals are propagated along central conductor 56A, and the outer conductors are coupled to ground potential. Note that the central conductor 56A is separated from the conductors disposed about its periphery by insulator layers 54 and 58. As discussed below, the structure shown in FIG. 6 is constructed using state-of-the-art metallization techniques. As such, the lateral length of the central conductor of the present transmission line is typically on the order of 0.5-10 microns.

Figure 7:
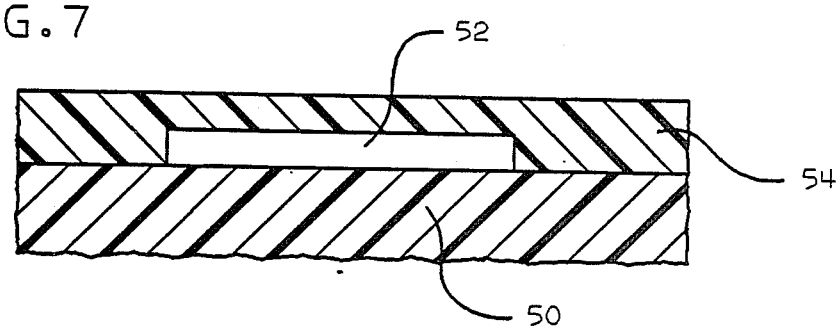
FIG. 7-FIG. 9 show cross sectional views of a substrate undergoing the process for forming the shielded transmission line of the present invention as shown in FIG. 6.

The method of constructing the totally shielded transmission line of the present invention will now be discussed with reference to FIGS. 7-9. As shown in FIG. 7, a conductor 52 is defined on an insulator layer 50. In general, layer 50 can be comprised of any insulating material (silicon oxide, silicon nitride, polyimide, doped glass, or combinations thereof) typically utilized in the semiconductor processing industry. Conductor 52 can be formed of aluminum, aluminum alloys, refractory metals, refractory metal alloys (e.g. silicides), doped polysilicon, or various combinations thereof. In a technology in which two layers of metal are used, the lower conductor layer 52 can be comprised of the same material (and thus formed at the same time) as the electrodes of the devices (e.g. FET or bipolar transistors, capacitors, etc.) formed elsewhere on the silicon substrate. In the present invention, this approach is preferred, and conductor 52 is made of a refractory metal silicide (such as tungsten silicide) that defines the gate electrodes of the FET devices. Conductor layer 52 can be subsequently patterned using any conventional technique. In the invention, it is preferred to cover the conductive layer with a photosensitive polymer that is exposed and developed to define the regions of conductive layer 52 that are to be removed. These portions are subsequently removed by exposure to an anisotropic etchant that does not appreciable attach underlaying portions of insulator layer 50. An example of such an etchant would be a chlorine- or fluorine-based gaseous plasma. After conductor layer 52 is patterned, the structure is coated with insulator layer 54. Similarly to the first insulator layer 50, insulator layer 54 can be comprised of any one of a number of conventional insulating materials. In the case where conductor layer 52 is formed simultaneously with the electrodes of the active devices provided elsewhere on the substrate, insulator layer 54 is comprised of a doped glass such as phosphosilicate glass (PSG) or borophosphosilicate glass (BPSG).

Figure 8:
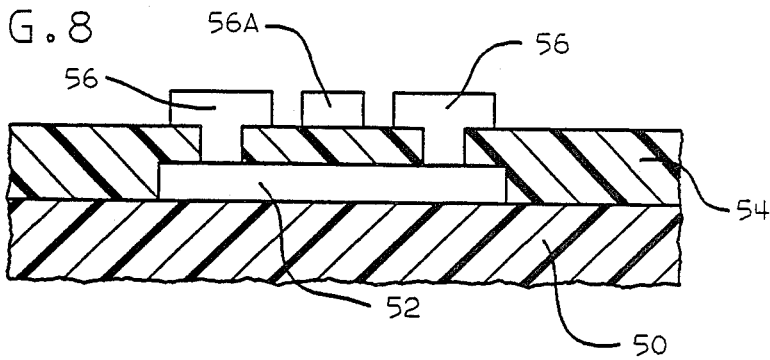
Figure 9:
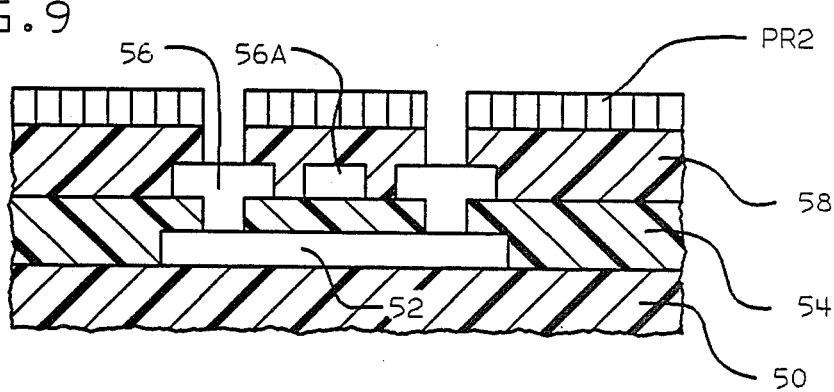

Then, as shown in FIG. 8, conductor layer 56 is deposited and patterned to define a pair of peripheral conductors and a central conductor 56A. The structure is formed by first etching troughs holes in insulator layer 54 to expose end portions of the patterned conductor layer 52. A photosensitive polymer is deposited and patterned so as to expose selective portions of insulator layer 54 to an anisotropic etchant (e.g. $CF_4/O_2$ directional plasma) without appreciably attacking underlaying portions of conductor layer 52. It is to be understood that such troughs can be etched to provide an isotropic profile to the etched troughs. Then, conductor layer 56 is deposited so as to fill the troughs holes formed in conductor layer 54, and is patterned to produce the structure shown in FIG. 8. Note that while conductor layer 56 can be composed of the same materials discussed with reference to conductor layer 52, in practice it is preferred to form conductor layer 56 from a material that can be chemically vapor deposited (CVD) so as to fill the troughs formed in insulator layer 54 without creating voids. It has been found that refractory metal layers such as tungsten provide good trough filling properties. Note that after patterning, the peripheral conductors are separated from and disposed about the central conductor 56A.

After conductor layer 56 is deposited and patterned as shown in FIG. 8, another insulator layer 58 is deposited on the structure. Insulator layer 58 can be formed from any conventional insulating material. Similarly to insulator layer 54, insulator layer 58 is then patterned by exposure of selected portions thereof (as defined by a photoresist layer PR2) to an anisotropic plasma etch that removes the exposed portions without appreciably etching underlaying portions of conductor layer 56. Note that the pattern defined by photoresist PR2 must be aligned with respect to the underlaying layers, so that the troughs etched into insulator layer 58 expose portions of the peripheral conductors 56 without exposing central conductor 56A. In practice, this alignment can be made less critical by lengthening the portions of peripheral conductors 56 that are disposed along the upper surface of insulator layer 54. After the troughs are formed in insulator layer 58, photoresist PR2 is removed and metal layer 60 is deposited and etched in a manner similar to that utilized to provide conductor layer 56, resulting in the structure shown in FIG. 6.

Figure 10:
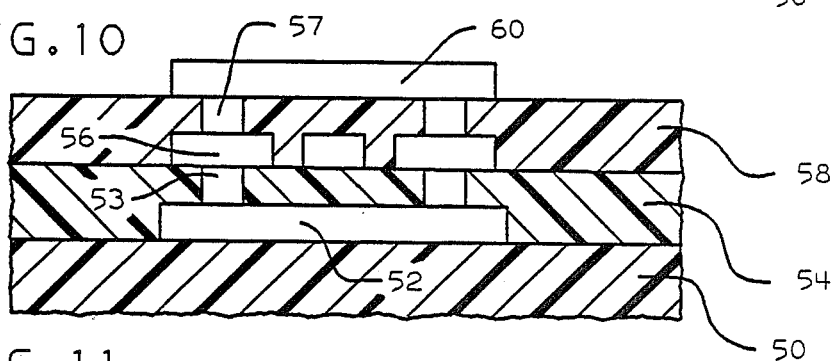
FIG. 10 shows a cross sectional view of a second embodiment of the totally shielded transmission line of the present invention.

FIG. 10 shows a second embodiment of the present invention, wherein separate metal layers are used to fill the troughs defined in insulator layers 54 and 58. That is, instead of using a single metal deposition to both fill the troughs hole defined in the insulator layer and define a metal line on the upper surface of the insulator layer, separate metal layers are provided. As shown in FIG. 10, the troughs formed in insulator layers 54 and 58 are filled with metal layers 53 and 57, respectively. Thus, the peripheral conductors are defined by conductor layers 53 and 56, and the upper plate structure is defined by conductor layers 57 and 60. In practice, a CVD material such as tungsten is used for its gap filling properties. One or both of the metal layers 56 and 60 can now be formed from a material (such as aluminum) that provides optimum conductivity properties, without these gap filled considerations.

Figure 11:
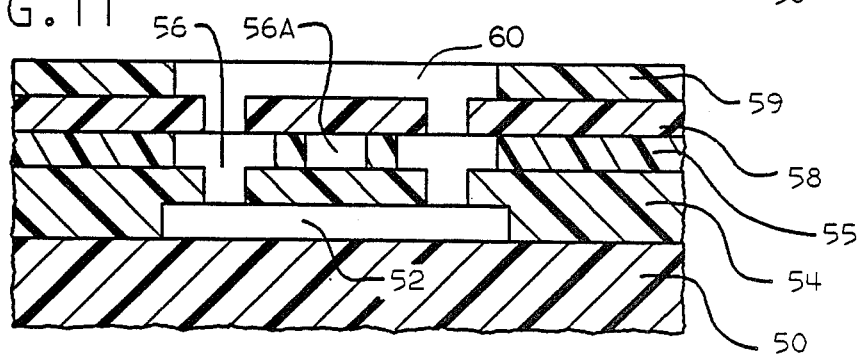
FIG. 11 shows a cross sectional view of a third embodiment of the totally shielded transmission line of the present invention.

FIG. 11 shows a third embodiment of the present invention, where a series of insulator layers are utilized to define the conductive structures. Insulator layer 54 is deposited on lower plate structure 52, and an insulator layer 55 is deposited thereon. The two insulator layers 54 and 55 are sequentially etched to define troughs as shown. Note that at least some of the troughs in layer 55 are formed above (and are wider than) the troughs formed in layer 54. The troughs in layer 55 define upper portions of the peripheral conductor structures as well as the central conductor structure. The conductive material 56 is then deposited to fill the respective troughs, and is planarized so that portions of the conductive material above the upper surface of insulator layer 55 are removed. This planarization procedure is taught in co-pending U.S. patent application Ser. No. 791,887 by Chow et al, entitled "Method for Producing Coplanar Multi-Level Metal/Insulator Films on a Substrate and for Forming Patterned Conductive Lines Simultaneously with Stud Vias," filed Oct. 28, 1985, and assigned to the assignee of the present invention, the teachings of which are incorporated herein by reference. Insulator 58 is then deposited over the conductor 56, and another insulator layer 59 is then deposited thereon. A large trough is defined in insulator layer 59, to span over the smaller troughs formed in insulator layer 58. Then conductor layer 60 is deposited and planarized to fill the troughs in insulator layers 58 and 59 to form the upper plate structure.

As shown by the foregoing description, a first feature of the invention is that it provides a totally shielded transmission line of integrated circuit dimensions.

A second feature of the invention is that the shielded transmission line can be processed concurrently with the metallization layers used to interconnect the various devices formed on the semiconductor substrate.

It is to be understood that while various modifications to the structure and teachings described above may occur to a person of ordinary skill in the art, such modifications fall within the spirit and scope of the present invention.

What is claimed is:

1. A method for forming a shielded transmission line, comprising the steps of:

forming a first insulator layer;

forming a first conductor layer on a surface of said first insulator layer, and patterning said first conductor layer to form a first conductive plate structure;

forming a second insulator layer on said first insulator layer and said first conductor layer;

etching said second insulator layer to form troughs therein that expose end portions of said first conductive plate structure;

forming a second conductor layer on said second insulator layer, said second conductor layer filling said troughs in said second insulator layer to contact said first plate structure;

patterning said second conductor layer so as to define a central conductor structure and a pair of peripheral conductor structures separated from and disposed about said central conductor structure, said peripheral conductor structures being coupled to said first plate structure;

forming a third insulator layer on said second insulator layer and said second conductor layer;

etching said third insulator layer to form troughs therein that expose said peripheral conductor structures;

depositing a third conductor layer on said third insulator layer, said third conductor layer filling said troughs in said third insulator layer to contact said peripheral conductor structures; and patterning said third conductor layer so as to form a second plate structure coupled to said peripheral conductor structure.

2. The method for forming a shielded transmission line as recited in claim 1, wherein said conductor structures are comprised of a material selected from the group consisting of aluminum, aluminum alloys, refractory metals, refractory metal alloys, doped polysilicon, and mixtures thereof.

3. The method for forming a shielded transmission line of claim 1, wherein said insulator layers are comprised of a material selected from the group consisting of silicon oxide, silicon nitride, polyimide, doped glass, and mixtures thereof.

4. A method for forming a shielded transmission line, comprising the steps of:

forming a first insulator layer;

forming a first conductor layer on a surface of said first insulator layer, and patterning said first conductor layer to form a first conductive plate structure;

forming a second insulator layer on said first insulator layer and said first conductor layer;

forming a third insulator layer on said second insulator layer, and patterning said third insulator layer to define troughs therein;

patterning portions of said second insulator layer beneath some of said troughs in said third insulator layer, to form vias in said second insulator layer;

depositing a second conductor layer to fill said troughs in said third insulator layer and said vias in said second insulator layer, so as to define a central conductor structure and a pair of peripheral conductor structures within said troughs in said third insulator layer, said peripheral conductor structures being separated from and disposed about said central conductor structure, said peripheral conductor structures being coupled to said first plate structure through said vias in said second insulator layer;

forming a fourth insulator layer on said third insulator layer and on said second conductor layer;

forming a fifth insulator layer on said fourth insulator layer, and patterning said fifth insulator layer to define troughs therein;

patterning portions of said fourth insulator layer beneath some of said troughs in said fifth insulator layer to form vias in said fourth insulator layer;

depositing a third conductor layer to fill said troughs in said fifth insulator layer and said vias in said fourth insulator layer, so as to define a second conductive plate structure in said fifth insulator layer peripheral portions of said second conductive plate structure being coupled to said peripheral conductor structures through said vias in said fourth insulator layer

* * * * *